(12) United States Patent
Devin

(10) Patent No.: US 7,453,732 B2
(45) Date of Patent: Nov. 18, 2008

(54) METHOD FOR PROGRAMMING MEMORY CELLS INCLUDING TRANSCONDUCTANCE DEGRADATION DETECTION

(75) Inventor: Jean Devin, Le Tholonet (FR)

(73) Assignee: STMicroelectronics SA, Montrouge (FR)

( * ) Notice: Subject to any disclaimer, the term of this patent is extended or adjusted under 35 U.S.C. 154(b) by 11 days.

(21) Appl. No.: 11/742,334

(22) Filed: Apr. 30, 2007

(65) Prior Publication Data

US 2007/0201278 A1 Aug. 30, 2007

Related U.S. Application Data

(62) Division of application No. 11/215,311, filed on Aug. 30, 2005, now Pat. No. 7,218,553.

(30) Foreign Application Priority Data

Aug. 31, 2004 (FR) ................................. 04 09215

(51) Int. Cl.
*G11C 11/34* (2006.01)
(52) U.S. Cl. ............................... 365/185.22; 365/185.2
(58) Field of Classification Search ............ 365/185.22, 365/185.2, 185.19, 185.24
See application file for complete search history.

(56) References Cited

U.S. PATENT DOCUMENTS 5,532,962 A 7/1996 Auclair et al.
5,892,714 A 4/1999 Choi
6,049,480 A 4/2000 Chang
6,195,290 B1 2/2001 Dallabora et al.
6,205,056 B1 3/2001 Pan et al.
6,363,016 B1 * 3/2002 Lin et al. ................ 365/185.27
6,788,579 B2 9/2004 Gregori et al.
6,816,413 B2 * 11/2004 Tanzawa ................... 365/185.2
7,193,898 B2 * 3/2007 Cernea ................... 365/185.22
7,236,402 B2 * 6/2007 Suhail ................... 365/185.22
2003/0142546 A1 7/2003 Yano
2004/0017722 A1 1/2004 Cavaleri et al.

* cited by examiner

*Primary Examiner*—Anh Phung
(74) *Attorney, Agent, or Firm*—Lisa K. Jorgenson; Eric M. Ringer; Seed IP Law Group PLLC

(57) ABSTRACT

The present invention relates to a method for programming a memory cell having a determined transconductance curve. The programming of the memory cell comprises a series of programming cycles each comprising a step of verifying the state of the memory cell. According to the present invention, the verify step comprises a first read of the memory cell with a first read voltage greater than a reference threshold voltage, and a second read of the memory cell with a second read voltage lower than or equal to the reference threshold voltage. The memory cell is considered not to be in the programmed state if first- and second-read currents flowing through the memory cell are above determined thresholds, and programming voltage pulses are applied to the memory cell while the latter is not in the programmed state. Application in particular to the programming of Flash memory cells.

16 Claims, 9 Drawing Sheets

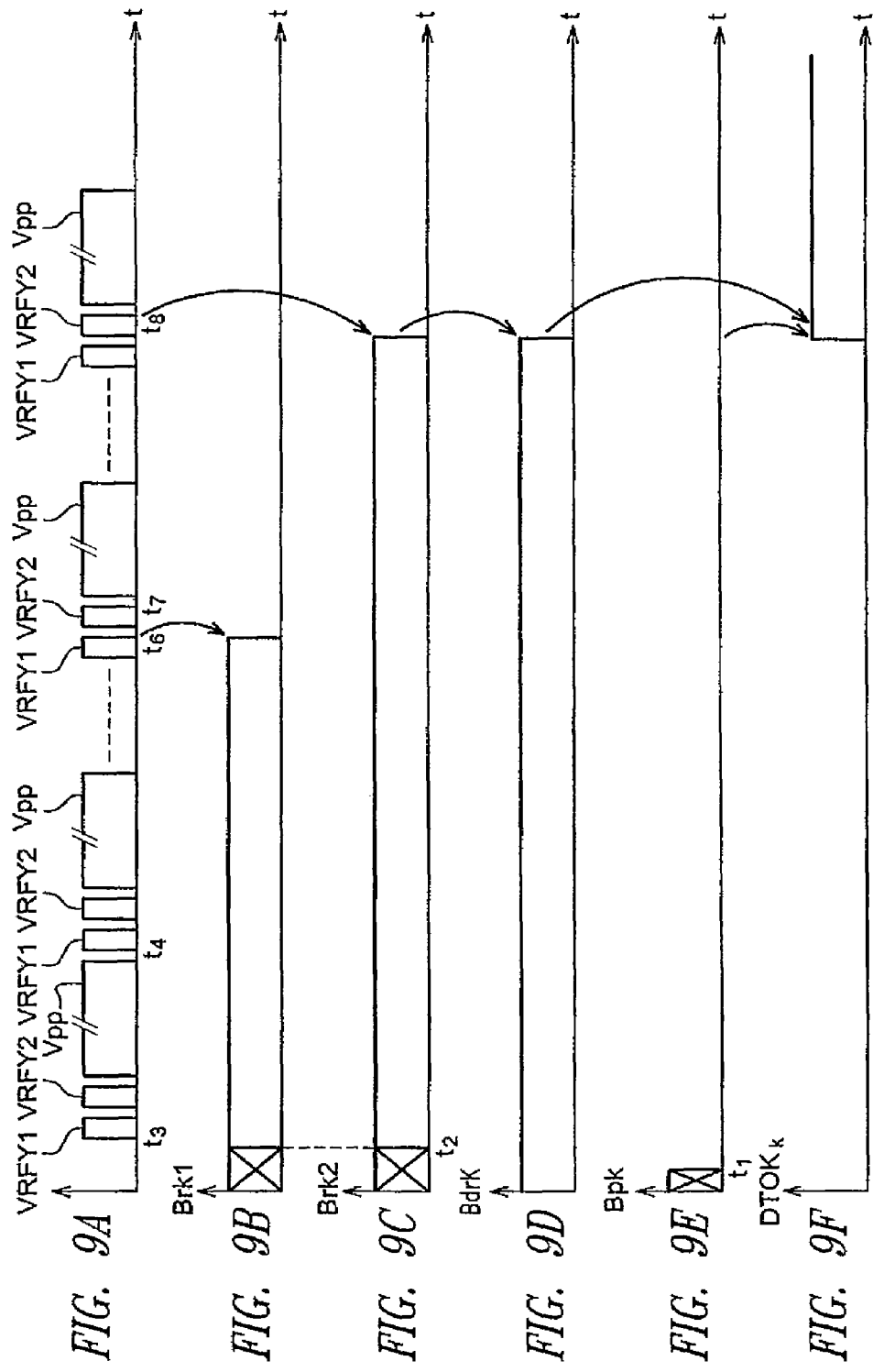

ethod for Programming Memory Cells Including Transconductance Degradation Detection

CROSS-REFERENCE TO RELATED APPLICATION

This application is a divisional of U.S. patent application Ser. No. 11/215,311, filed Aug. 30, 2005, now U.S. Pat. No. 7,218,553, issued on May 15, 2007, which application is incorporated herein by reference in its entirety.

BACKGROUND OF THE INVENTION

1. Field of the Invention

The present invention relates to electrically erasable and programmable memories integrated onto silicon chips, and more particularly to programming memory cells in such memories.

2. Description of the Related Art

Electrically erasable and programmable memories, particularly Flash memories, are generally designed to execute a programming operation in several cycles. Each cycle comprises, for each memory cell that is to be programmed, a step of verifying the state of the memory cell and a step of programming the memory cell. The programming step is performed if the memory cell is seen as not being in the programmed state during the verify step.

Figure 1B:
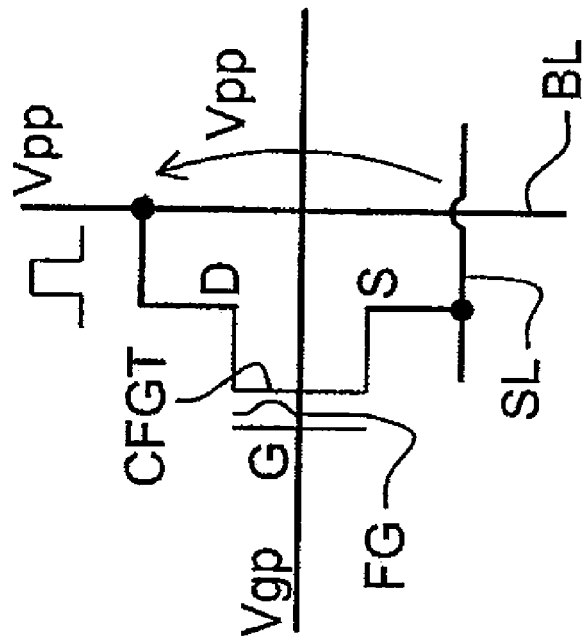
Figure 1A:
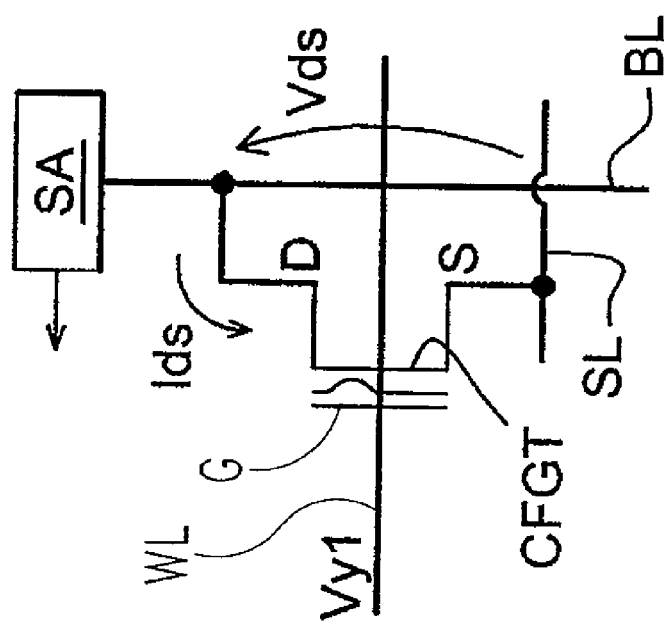

An example implementation of the verification step is shown in FIG. 1A. FIG. 1A represents a Flash-type memory cell formed by an NMOS-type floating-gate transistor CFGT. The memory cell is arranged in a memory array (not represented) comprising a plurality of memory cells arranged in lines and columns, such that the drain D of the transistor CFGT is linked to a bit line BL, its source S is linked to a source line SL, and its control gate G is linked to a word line WL. The verify step is performed by a sense amplifier SA linked to the bit line BL. The sense amplifier SA applies a determined drain-source voltage to the transistor CFGT, generally a voltage on the order of 1V, while a read voltage Vy1 is applied to the control gate G. The amplifier SA compares the drain-source current Ids flowing through the transistor with a reference current Iref1. If the current Ids is lower than Iref1, the memory cell is considered to be in a programmed state. If the current Ids is greater than Iref1, the memory cell is considered to be in an erased state.

The voltage Vy1 is greater than a reference voltage $VT_{ref}$ that represents the minimum threshold voltage targeted for a floating-gate transistor to be considered to be in the programmed state. The reference current Iref1 corresponds to the current flowing through a floating-gate transistor having the threshold voltage $VT_{ref}$ when the latter receives the voltage Vy1 at its control gate.

An example of implementation of the programming step is shown in FIG. 1B. A pulse of a programming voltage Vpp, generally on the order of 5 to 10V, is applied between the drain and the source of the transistor CFGT, while a voltage Vgp is applied to its control gate. A current passes through the channel of the transistor CFGT and negative electric charges are injected and trapped in the floating gate (FG) of the transistor. The threshold voltage VT of the transistor increases by a determined increment. After one or more programming voltage Vpp pulses, each preceded by a verify step, the threshold voltage VT of the transistor reaches, in principle, a value at least equal to the reference voltage $VT_{ref}$.

Figure 2:
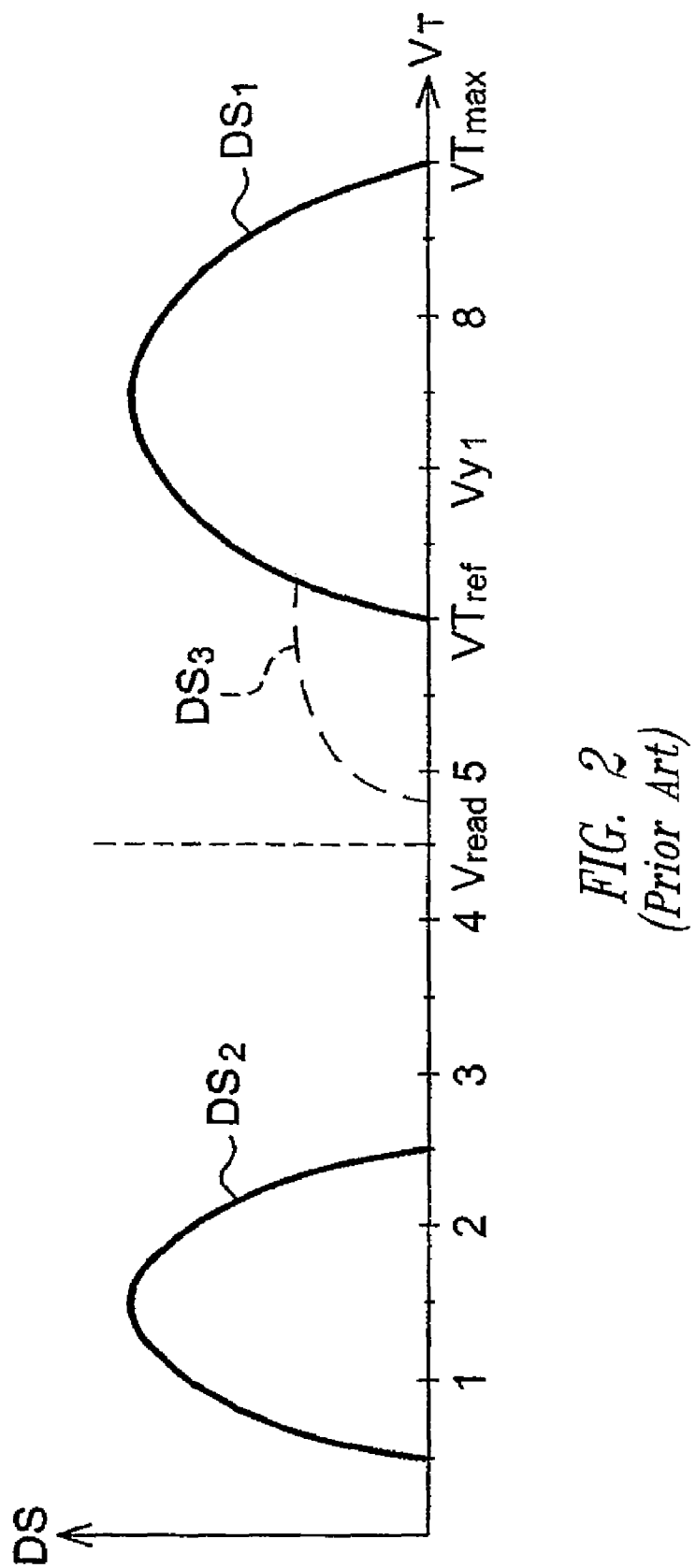

Thus, the statistical distribution of the threshold voltages of a plurality of memory cells within a same memory array must, in principle, conform to a curve $DS_1$ represented in FIG. 2, and the threshold voltages must be between the reference voltage $VT_{ref}$, on the order of 6V for example, and a maximum voltage $VT_{max}$, on the order of 9V for example, the voltage Vy1 being on the order of 6.5V for example. FIG. 2 further represents a curve $DS_2$ showing the statistical distribution of the threshold voltages of memory cells in the erased state, which is between 0.5V and 2.5V for example. A read voltage $V_{read}$, representing the gate voltage applied to the memory cells during a normal read of the memory array, is also represented. The voltage $V_{read}$ is different from the read-verify voltage Vy1 and is between the two distribution curves $DS_1$, $DS_2$, for example in the vicinity of 4.5V.

BRIEF SUMMARY OF THE INVENTION

The present invention provides a method for programming a memory cell comprising a floating-gate transistor, in a series of programming cycles each comprising a step of verifying the state of the memory cell followed by applying a pulse of a programming voltage to the memory cell if the verify step shows that the cell is not in the programmed state. The verify step comprising a first read of the memory cell by applying a first read voltage greater than a reference threshold voltage to a control gate of the memory cell. The memory cell being considered not to be in the programmed state, with reference to the first read, if a first-read current flowing through the memory cell is above a first threshold. The step of verifying the memory cell further comprises a second read of the memory cell by applying a second read voltage, lower than or equal to the reference threshold voltage, to the memory cell control gate. The memory cell is not considered to be in the programmed state with reference to the second read if a second-read current flowing through the memory cell is above a second threshold. Programming voltage pulses are applied to the memory cell while the memory cell is considered not to be in the programmed state with reference to at least one of the two reads. In one embodiment, a predetermined number of programming pulses, representative of a failure of the memory cell, is not exceeded.

According to one embodiment, the second threshold is substantially zero or very low and on the order of between a few hundred and a few thousand nanoamperes.

According to one embodiment, the read of the verify step is performed by comparing the current flowing through the memory cell to a reference current forming the first threshold flowing through a reference memory cell having a non-degraded transconductance curve, the threshold voltage of which forms the reference threshold voltage.

According to one embodiment, an offset current forming the second threshold is injected in parallel with the reference memory cell to perform the second read.

According to one embodiment, the method comprises the following steps: at the end of the first read of the verify step, supplying a first bit representative of the programmed or erased state of the memory cell with reference to the first read, at the end of the second read of the verify step, supplying a second bit representative of the programmed or erased state of the memory cell with reference to the second read, calculating a double-read bit by logically combining the first and second bits, and applying a programming voltage pulse to the memory cell if the double-read bit has a determined logic value.

According to one embodiment, the method comprises a step of storing the first bit, a step of storing the second bit and a step of applying the first and second bits to a logic circuit to obtain the double-read bit.

According to one embodiment, the method comprises the following steps: supplying programming voltage pulses, comparing a bit to be saved in the memory cell to the double-read bit, and supplying a control signal that has a determined value which inhibits the application of the programming voltage pulses to the memory cell, if the double-read bit has a logic value opposite the determined value or if the bit to be saved has an erase logic value.

The present invention also relates to a method for collectively programming a plurality of memory cells, wherein each memory cell is programmed by individually applying the programming method according to the present invention to each memory cell, it being possible for the number of programming voltage pulses that each memory cell receives to be different depending on the state of degradation of the transconductance curve of each memory cell.

The present invention also relates to a memory comprising memory cells each comprising a floating-gate transistor, a programming circuit and a read circuit arranged for applying a series of programming cycles to a memory cell to be programmed. Each programming cycle comprises a step of verifying the memory cell followed by applying a pulse of a programming voltage to the memory cell if the verify step shows that the memory cell is not in the programmed state.

The read circuit is arranged for performing, during each verify step, a first read of the memory cell by applying a first read voltage greater than a reference threshold voltage to a control gate of the memory cell, and supplying a first bit having a first determined logic value if a first-read current flowing through the memory cell is above a first threshold.

The read circuit is configured to perform, during each verify step, a second read of the memory cell by applying a second read voltage lower than or equal to the reference threshold voltage to its control gate, and supplying a second bit having a second determined logic value if a second-read current flowing through the memory cell is above a second threshold. The programming circuit is configured to apply programming voltage pulses to the memory cell while the first bit has the first logic value or while the second bit has the second logic value, without exceeding a number of programming pulses representative of a failure of the memory cell.

According to one embodiment, the second threshold is substantially zero or very low and on the order of between a few hundred and a few thousand nanoamperes.

According to one embodiment, the read circuit comprises a sense amplifier comprising a reference memory cell having a non-degraded transconductance curve, the threshold voltage of which forms the reference threshold voltage. The sense amplifier further comprises a means for comparing the first-read current flowing through the memory cell to be read with a reference current flowing through the reference memory cell and forming the first threshold.

According to one embodiment, the sense amplifier comprises an offset current generator arranged in parallel with the reference memory cell, the offset current forming the second threshold.

According to one embodiment, the read circuit comprises means for supplying a double-read bit by logically combining the first and second bits.

According to one embodiment, the read circuit comprises a serial comparator comprising means for storing the first bit, means for storing the second bit, and a logic circuit for combining the first and second bits, supplying the double-read bit.

According to one embodiment, the programming circuit is arranged for supplying a control signal which inhibits the application of the programming voltage pulses to the memory cell if the double-read bit has a determined logic value or if a bit to be saved in the memory cell has an erase logic value.

According to one embodiment, the first and second reads are synchronised by pulsed control signals comprising shifted pulses.

In one embodiment, the present invention aims to provide a method for programming memory cells that can detect the presence of memory cells having a degraded transconductance and which ensures that such memory cells receive a sufficient number of programming voltage pulses for their threshold voltage to be taken to a value greater than the read voltage $V_{read}$ of the normal read process.

To achieve this object, the present invention is based on the observation that a memory cell that is not completely programmed, i.e. which has a threshold voltage below the reference voltage $VT_{ref}$, has a non-zero drain-source current when it is read with a read voltage below the threshold $VT_{ref}$. Thus, an inventive principle of the present invention is to provide, in addition to the read-verify performed with a voltage Vy1 above the threshold $VT_{ref}$, an additional read-verify performed with a read voltage Vy2 below $VT_{ref}$. If the memory cell is on during the second read, the threshold voltage of the memory cell is below $VT_{ref}$ and the cell needs to receive additional programming voltage pulses.

BRIEF DESCRIPTION OF THE SEVERAL VIEWS OF THE DRAWING(S)

Figure 3:
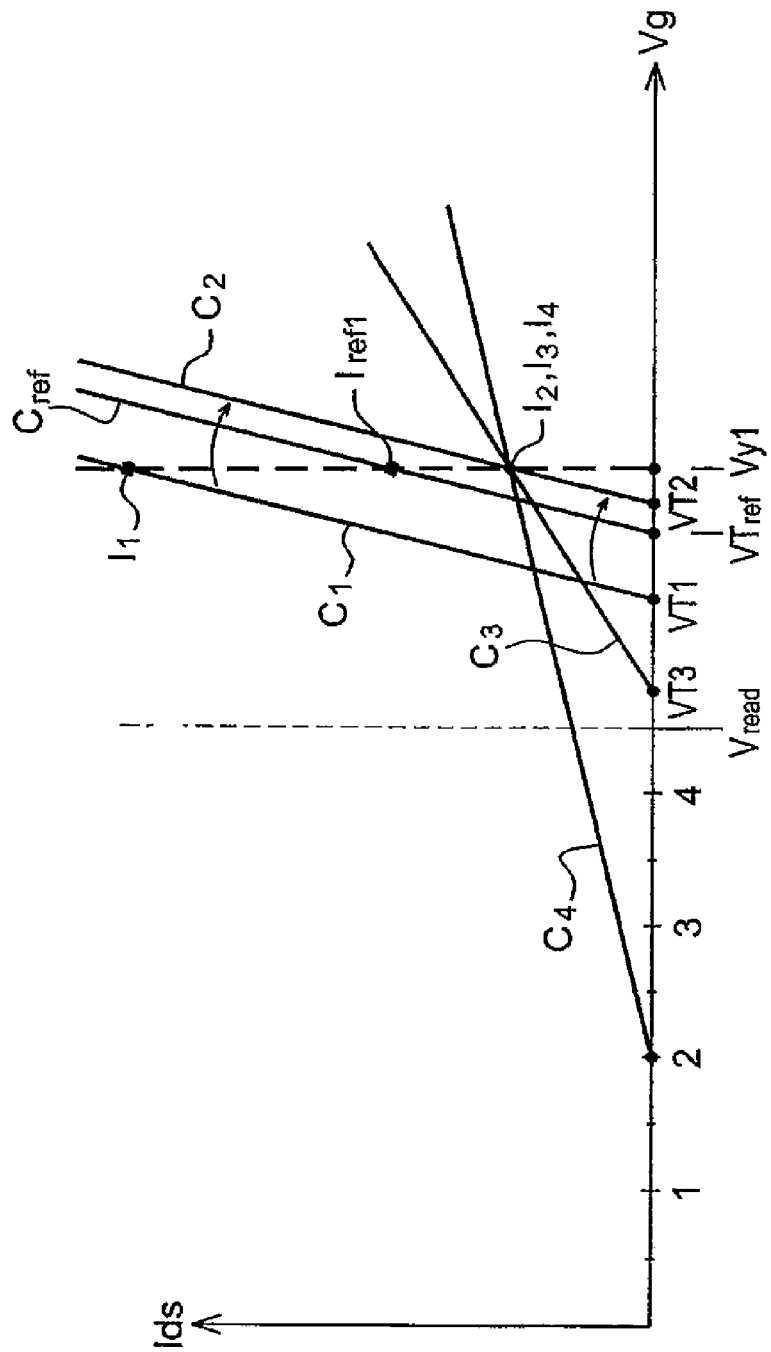
Figure 4:
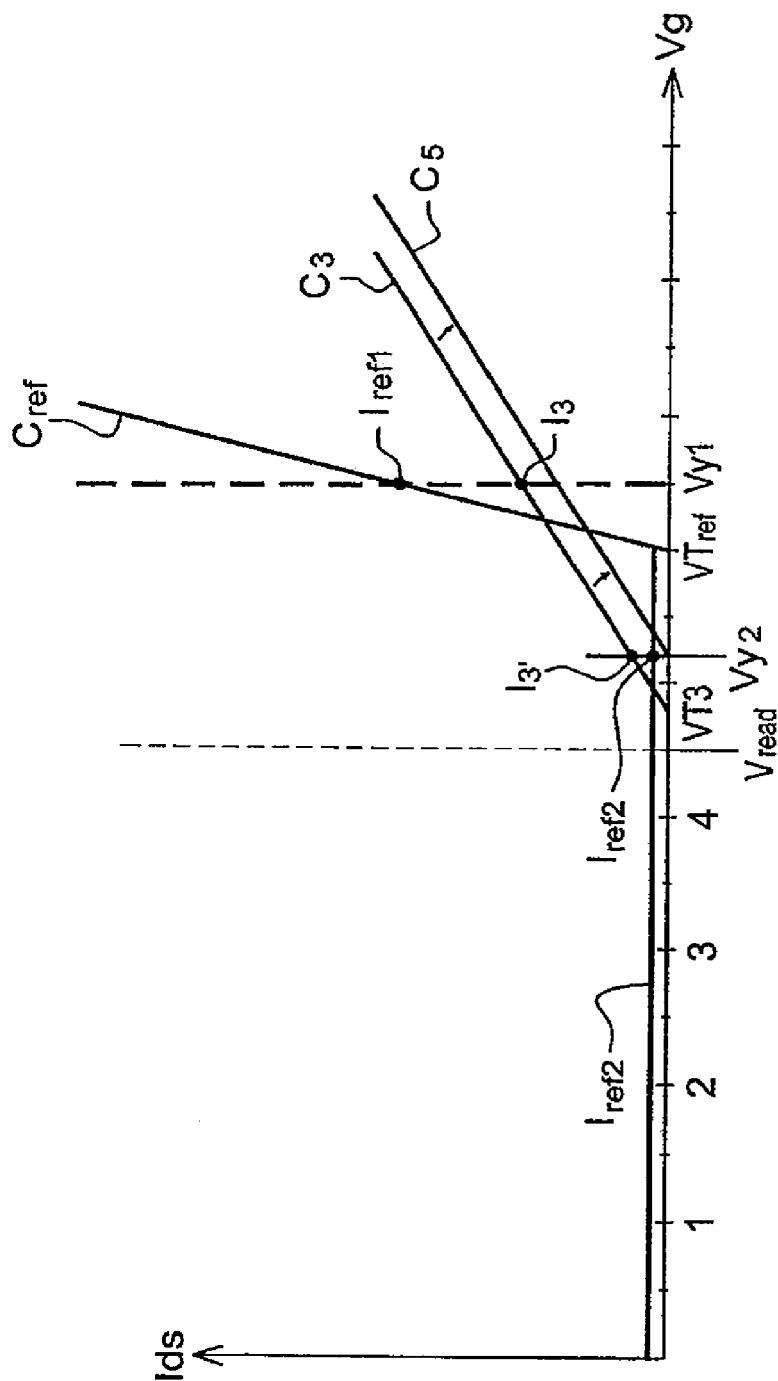
Figure 5:
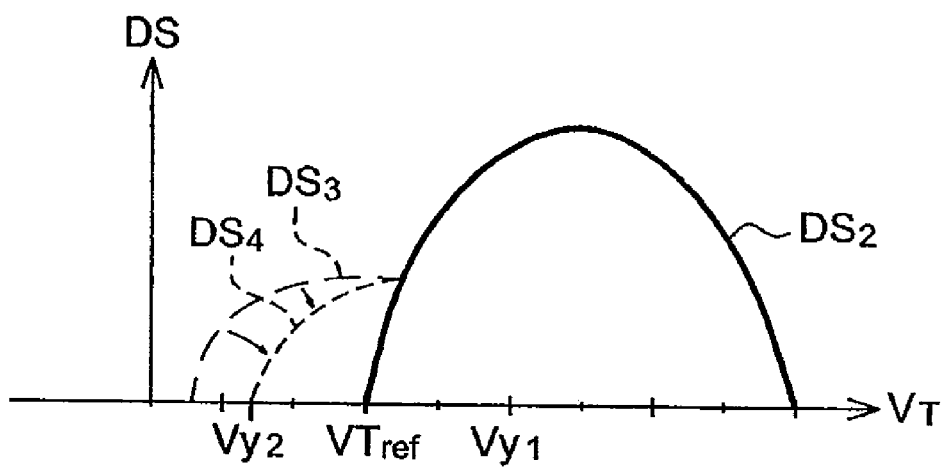
Figure 6:
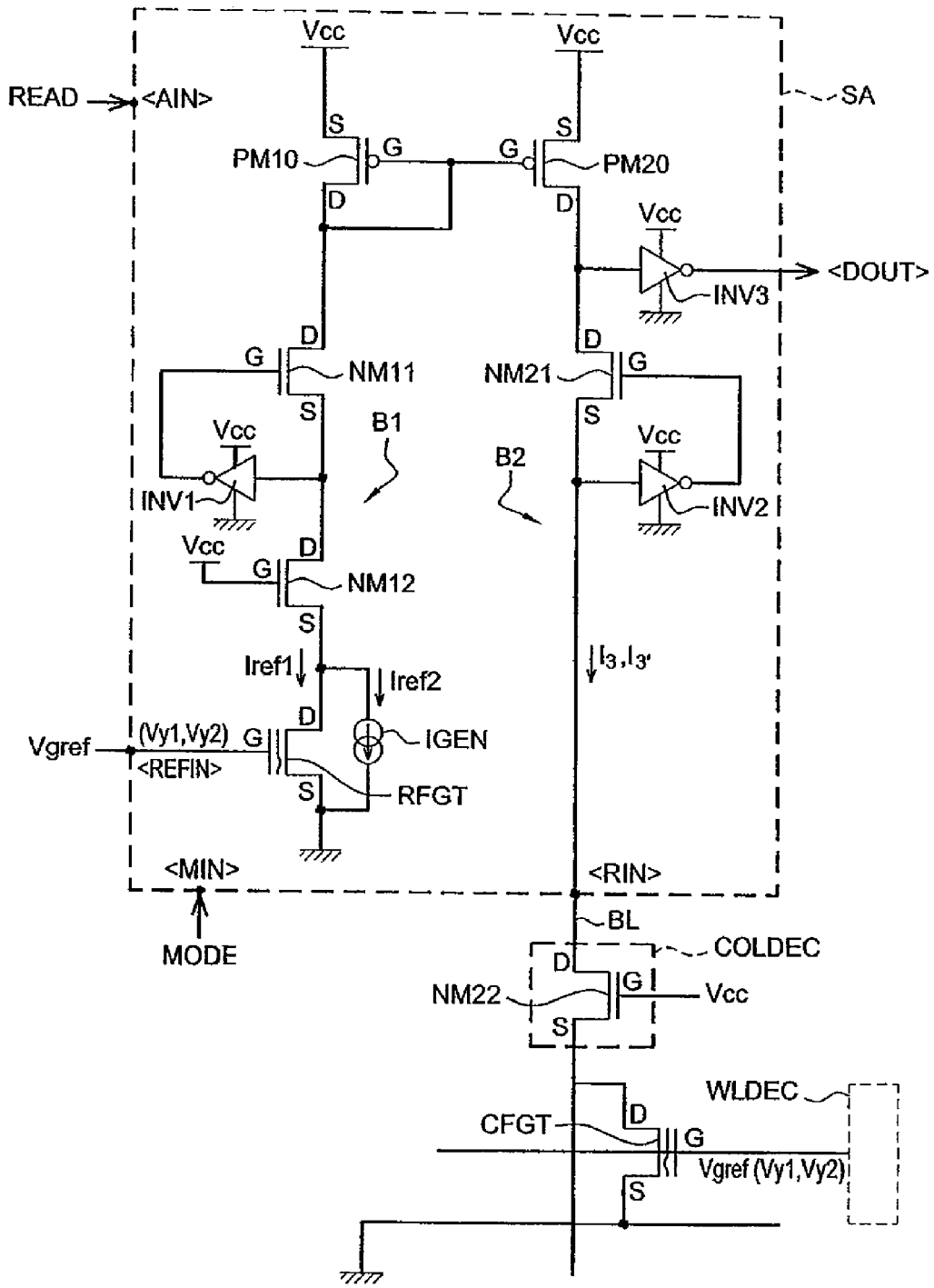
Figure 7:
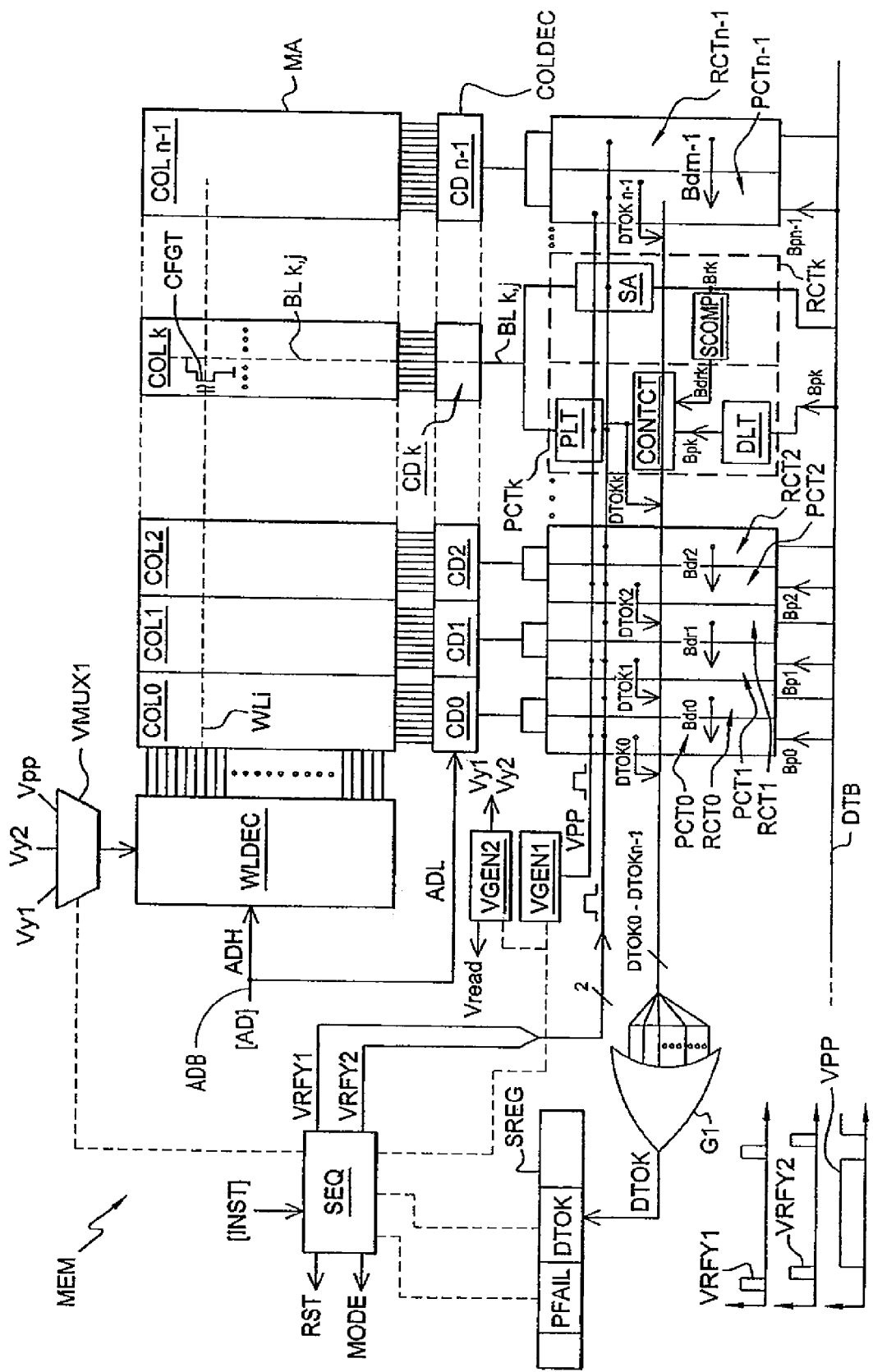
Figure 8:
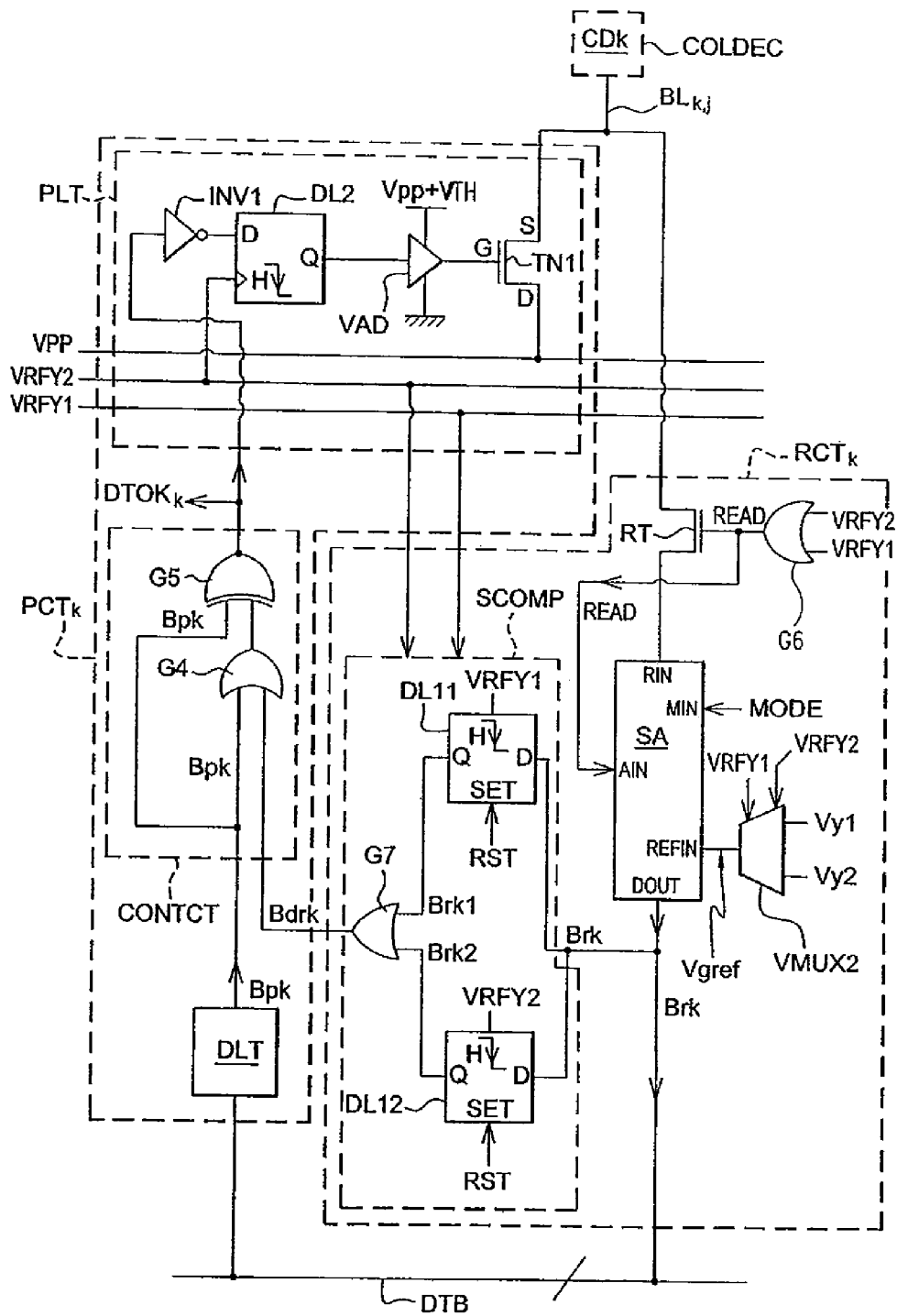

These and other objects, features and advantages of the present invention will be explained in greater detail in the following description of the method according to the present invention and of an example embodiment of a memory according to the present invention, given in relation with, but not limited to the following figures:

FIGS. 1A, 1B described above respectively represent a step of reading-verifying and a step of programming a memory cell, FIG. 2 described above represents statistical distribution curves of memory cell threshold voltages and shows the technical problem solved by the present invention, FIG. 3 described above represents transconductance curves of memory cells and further shows the technical problem solved by the present invention, FIG. 4 depicts transconductance curves of a memory cell in the erased state and in the programmed state, and shows the programming method according to the present invention, FIG. 5 represents a statistical distribution curve of threshold voltages of memory cells in the programmed state, and shows the corrective effect provided by a method according to the present invention, FIG. 6 represents an example sense amplifier architecture, enabling a method according to the present invention, FIG. 7 is a block diagram representing the general architecture of a memory comprising programming means according to the present invention, FIG. 8 represents examples of embodiments of elements represented in block form in FIG. 7, and FIG. 9A to 9F are timing diagrams of signals appearing in the memory of FIG. 7, and show the sequence of a programming phase according to the present invention.

DETAILED DESCRIPTION OF THE INVENTION

The present invention aims to solve a problem originally detected by the discovery of an anomaly in the distribution of the threshold voltages of memory cells in the programmed state. Such an anomaly is represented in FIG. 2 by a curve $DS_3$ which forms a spurious excrescence extending to the left of the curve $DS_1$. Against typical expectations, certain programmed memory cells have threshold voltages below $VT_{ref}$ although they are verified during their programming and although they have a current Ids greater than the reference current Iref1.

According to the present invention, such an error in the statistical distribution of the threshold voltages is attributable to a degradation of the transconductance curve Ids=f(Vgs) of the memory cells, occurring when they undergo a significant number of electrical stress cycles. The electrical stress phenomenon is well known by those skilled in the art. It is particularly problematic in page-erasable Flash memories, since the memory cells can receive the programming voltage Vpp a considerable number of times on their drain during the programming of neighboring memory cells belonging to the same bit line, without ever being erased (since the erasing is selectively applied to pages of the memory instead of being applied to an entire memory sector). The principal effect of the electrical stress is that the memory cells in the programmed state lose electric charges, such that their threshold voltage gradually decreases. This problem can be solved by regularly refreshing the memory cells. However, such a refresh does not solve the problem expounded above, which is linked to accelerated aging of the memory cells caused by the electrical stress suffered.

The degradation of the transconductance curve and the consequences thereof on the read-verify of a memory cell will be better understood with reference to FIG. 3. In FIG. 3, transconductance curves $C_1$, $C_2$, $C_{ref}$ and $C_4$ of floating-gate transistors are represented. These various curves show the operation of floating-gate transistors in saturated regime (Vgs<Vds, ohmic operating zone) and define the drain-source current Ids (vertical axis) flowing through the transistors according to the gate-source voltage Vgs (horizontal axis) that is applied to them. The transconductance curves are here represented in a simplified form sufficient to understand the present invention, i.e. in the form of an affine function of the type "Y=aX+b", with "Y" representing the current Ids, "X" representing the voltage Vgs, "a" representing the transconductance slope and "b" the voltage offset, representing the threshold voltage of the floating-gate transistor considered.

The curve $C_{ref}$ is a transconductance curve of a reference memory cell having a threshold voltage equal to $VT_{ref}$, for example 6.5V. The current Ids flowing through the reference cell when it receives the read-verify voltage Vy1 at its gate, forms the reference current $I_{ref1}$.

The curve $C_1$ is the non-degraded transconductance curve of a memory cell being programmed, the threshold voltage of which has a value VT1 (foot of the curve C1) lower than $VT_{ref}$ and greater than $V_{read}$. When the read-verify voltage Vy1 is applied to it, a drain-source current $I_1$ greater than $I_{ref1}$ flows through the cell and it is thus considered not to be programmed, despite the fact that the threshold voltage of this cell is greater than $V_{read}$ and that the memory cell would be read as being programmed during a normal read performed with the voltage $V_{read}$.

The curve $C_2$ is the transconductance curve of the same memory cell when the programming process is finished, i.e. after the memory cell has received one or more additional programming voltage pulses. Its threshold voltage then has a value VT2 greater than $VT_{ref}$ and, when the read-verify voltage Vy1 is applied to it, its drain-source current has a value I2 lower than Iref1.

The curve $C_3$ is the degraded transconductance curve of a memory cell having undergone a considerable number of electrical stress cycles. This memory cell has a threshold voltage VT3 lower than $VT_{ref}$ and substantially greater than $V_{read}$, and is assumed to be in the process of being programmed. The degradation of its transconductance results in a diminution of the slope "a" of the curve C3. When the memory cell is read with the voltage Vy1 during the read-verify step, a current $I_3$, lower than the current Iref1 and equal in this example to the current $I_2$, flows through it. Thus, the memory cell is considered by the sense amplifier to be in the programmed state and the programming voltage pulses stop being applied to it, although its threshold voltage has not reached the targeted threshold $VT_{ref}$.

This example degraded transconductance curve $C_3$ does not yet result in a read error in normal read mode, since the threshold voltage VT3 of the memory cell is above the voltage $V_{read}$. However, next generation Flash memories will comprise floating-gate transistors having an even shorter channel length than that of current generations (on the order of one tenth of a micrometer) and will be even more sensitive to electrical stress. Thus, the distribution error $DS_3$ could extend to the voltage $V_{read}$ or even beyond, such that it would no longer be possible to distinguish a programmed memory cell from an erased memory cell (this causing a read error or data corruption). There is also the danger that a memory cell might have transconductance degradation such that it will be read as being programmed, although it is in the erased state, from the first read-verify step of the programming process, before it has received the first programming voltage Vpp pulse. This risk is shown by a transconductance curve $C_4$, which has a threshold voltage of 2V corresponding to an erased memory cell but the slope of which is sufficiently slight for it to have, under the voltage Vy1, a programmed memory cell current $I_4$ (equal in this example to the current $I_2$).

FIG. 4 represents the reference transconductance curve $C_{ref}$ and the degraded transconductance curve $C_3$ described above. The curve $C_{ref}$ has a threshold voltage $VT_{ref}$ such as 6V for example. The transconductance curve $C_3$ has a threshold voltage VT3 lower than $VT_{ref}$ and a slope that is much slighter than that of the curve $C_{ref}$. As explained above, $VT_{ref}$ represents the minimum threshold voltage targeted for a programmed memory cell, but cannot be achieved with the classical verify-program method if the memory cell has transconductance degradation.

According to the present invention, a memory cell to be programmed, particularly the cell of transconductance $C_3$, is read by means of two different read voltages during the verify step that precedes the application of a programming voltage Vpp pulse.

As represented in FIG. 4, the first read-verify is performed by applying to the control gate of the floating-gate transistor of the memory cell a read-verify voltage Vy1 identical to the voltage Vy1 of the classical read-verify method. The read is performed with reference to the reference transconductance curve $C_{ref}$, i.e. with reference to a current $I_{ref1}$ such that $I_{ref1}=C_{ref}(Vy1)$. If the current $I_3$ flowing through the memory cell, such that $I_3=C_3(Vy1)$, is below the current $I_{ref1}$, the cell is considered to be programmed with reference to the first read-verify but this condition is not sufficient, according to the present invention, to stop the application of the programming voltage pulses.

According to the present invention, the second read-verify is performed by applying to the control gate of the memory cell a read-verify voltage Vy2 lower than or equal to $VT_{ref}$, such as 5.25V for example, and by observing whether the current $I_3$, flowing through the memory cell is greater than a reference current $I_{ref2}$ that is preferably zero or of very low value, such as 1 to 2 microamperes for example, and generally speaking on the order of between a few hundred nanoamperes and a few thousand nanoamperes. If the current $I_3$, is greater than $I_{ref2}$, that means the memory cell has a threshold voltage lower than Vy2 since it is on. The memory cell is therefore not completely programmed since the voltage Vy2 is itself lower than or equal to the threshold voltage $VT_{ref}$ targeted for a programmed memory cell. In these conditions, additional programming voltage Vpp pulses are applied to the memory cell, at least until the current $I_3$, is lower than or equal to $I_{ref2}$.

Thus, in FIG. 4, the curve $C_3$ moves to the right until it forms a curve $C_5$ having a threshold voltage VT5 at least equal to Vy2 (the last programming voltage pulse being capable of taking the threshold voltage to a higher value). In previous practices, the memory cell having the transconductance curve $C_3$ would have been considered to be programmed upon the read-verify with the voltage Vy1, such that it would have had the threshold voltage VT3 at the end of the programming process.

FIG. 5 represents the correction of the anomaly $DS_3$ observed in the threshold voltage distribution made possible by the method of the present invention. The protuberance that the curve $DS_3$ constitutes compared to the expected distribution curve $DS_2$ is substantially reduced to form a curve $DS_4$ more similar to the curve $DS_2$ than the curve $DS_3$. More particularly, the corrected statistical distribution $DS_4$ has a limit on the left equal to the second-read-verify voltage Vy2. Thus, in theory, the ideal value of voltage Vy2 may be close to $VT_{ref}$ and practically equal to $VT_{ref}$ to obtain the expected distribution $DS_2$. In practice, technical constraints imposed by the operation of the sense amplifiers suggest that the voltage Vy2 should preferably be at a certain distance from $VT_{ref}$.

The present invention enables the threshold voltages of memory cells having a degraded transconductance to be brought back to within a sufficiently narrow range of values to overcome the risk of drift mentioned above.

One aspect of the present invention relates to the production of a sense amplifier enabling a memory cell to be read both with the voltage Vy1 and the voltage Vy2. Classical sense amplifiers require a minimum current so that its comparison branches operate correctly, and do not enable a second read according to the present invention to be performed due to the reference current $I_{ref2}$, which is too low to be set by a transconductance curve of a reference memory cell. A principle of the present invention is to provide, in a sense amplifier, a current generator supplying an offset current equal to $I_{ref2}$. This current $I_{ref2}$ is low, but sufficient to prevent the sense amplifier from turning off and for the sense amplifier to be able to compare this current $I_{ref2}$ with the current flowing through the memory cell being programmed. FIG. 6 represents an example embodiment of such a sense amplifier SA. The amplifier comprises two branches B1, B2 arranged in current mirror configuration. The branch B1 comprises a PMOS transistor PM10, two NMOS transistors NM11, NM12, and a reference memory cell formed by a floating-gate transistor RFGT. The branch B2 comprises a PMOS transistor PM20 and an NMOS transistor NM21.

The transistor PM10 receives a supply voltage Vcc at its source (S), its gate (G) is connected to its drain (D) and to the gate of the transistor PM20 such that transistor PM10 and transistor PM20 are arranged in a current mirror configuration. The drain of transistor PM10 is linked to the drain of the transistor NM11, the source of which is brought back to the gate through an inverting gate INV1 powered by the voltage Vcc. The source of the transistor NM11 is also linked to the drain of transistor NM12, the gate of which is biased by the voltage Vcc in a cascade assembly. The source of transistor NM12 is linked to the drain of the reference memory cell RFGT. The source of the memory cell RFGT is linked to ground and its gate is linked to an input REFIN of the sense amplifier, to which a reference voltage Vgref is applied.

In the branch B2 the transistor PM20 receives the voltage Vcc at its source. The drain of transistor PM20 is linked to the drain of the transistor NM21 the source of which is brought back to the gate of transistor NM21 through an inverting gate INV2 powered by the voltage Vcc. The source of transistor NM21 forms a read input RIN of the amplifier SA. The amplifier SA further comprises a data output DOUT, here linked to the drain of transistor PM20 through an inverting gate INV3.

The reference memory cell RFGT has the transconductance curve $C_3$ described above in relation to FIGS. 3 and 4 and a threshold voltage equal to $VT_{ref}$. A current $I_{ref1}$ flows through the reference memory cell RFGT when Vgref=Vy1, and the reference memory cell RFGT is not on when Vgref=Vy2. As proposed above, the amplifier SA comprises a current source IGEN in parallel with the reference cell RFGT, which imposes an offset current equal to the current Iref2 in the branch B1 when the voltage Vgref is equal to Vy2 and the reference memory cell is not on (since Vy2<$VT_{ref}$).

When a memory cell formed by a floating-gate transistor CFGT is read, the input RIN of the amplifier is coupled to the drain of the floating-gate transistor CFGT through at least one transistor NM22 belonging to a column decoder COLDEC, the gate of which is biased by the voltage Vcc. The elements in the branch B2 of the amplifier, once connected to the transistor NM22 and to the memory cell CFGT, form a mirror branch having substantially the same structure as the branch B1.

The reading of the memory cell CFGT is triggered by applying to its control gate the same reference voltage Vgref as the one applied to the reference memory cell RFGT, i.e. the voltage Vy1 or the voltage Vy2, while the source of the memory cell CFGT is linked to the ground. The voltage Vgref is applied to the memory cell CFGT through a word line decoder WLDEC and a word line WL to which the control gate of the memory cell CFGT is coupled.

When the voltage Vgref=Vy1 is applied, the output node of the amplifier (drain of the transistor PM20) is pulled to ground if the current in the memory cell CFGT is greater than the reference current Iref1 flowing through the reference memory cell RFGT. The output DOUT changes to 1 which indicates by convention that the memory cell CFGT is read as being in the erased state. In the opposite case, the output node is pulled to the voltage Vcc and the output DOUT changes to 0, which means by convention that the memory cell is read as being in the programmed state.

When the voltage Vgref=Vy2 is applied, the output node of the amplifier (drain of the transistor PM20) is pulled to the ground if the current in the memory cell CFGT is greater than the reference current Iref2 imposed in the branch B1 by the current generator IGEN, the reference memory cell RFGT being off. The output DOUT then changes to 1. In the opposite case, the output node is pulled to the voltage Vcc and the output DOUT changes to 0.

Thus, according to the present invention, the memory cell is only considered to be programmed if the sense amplifier supplies the programming logic value, here 0, during the two reading steps. In the opposite case, programming voltage pulses continue to be applied to the memory cell.

Above, the elements required to execute the read-verify steps according to the present invention have been described. In one complete embodiment of a sense amplifier, the sense amplifier further comprises an activation input AIN, driven by a signal READ, and power-on means. It further comprises an input MIN receiving a signal MODE, at least one other reference cell having a transconductance curve appropriate for a normal read performed with the voltage $V_{read}$, and means for selecting this reference memory cell or the memory cell RFGT depending on the value of the signal MODE which thus defines whether a read must be performed in verify mode or in normal mode. These various means are not illustrated in FIG. 6 for simplicity, bur are well known to those skilled in the art.

FIG. 7 illustrates an example embodiment of a memory MEM comprising a programming device implementing a method according to the present invention will now be described.

The memory comprises a memory array MA comprising Flash-type memory cells formed by floating-gate transistors CFGT linked to word lines WLi and to bit lines BLk,j. The bit lines are grouped together into n physical columns COLk (COL0, COL1, COL2, ... COLn−1), k being a column index ranging from 0 to n−1. Each physical column of rank k comprises j bit lines BLk,j, j being an index ranging from 0 to j−1. The bit lines BLk,j are linked to the drains of the floating-gate transistors CFGT, while the word lines WLi are linked to the control gates of the transistors CFGT. The memory cells linked to the bit lines BLk,j of a column COLk contain bits of the same significance. Thus, a binary word of n bits is saved in n memory cells each located in a determined physical column. A page of the memory is formed by all of the memory cells linked to the same word line WLi and comprises j words of n bits each.

The memory further comprises a word line decoder WLDEC linked to the word lines of the memory array MA, a column decoder COLDEC linked to the bit lines of the memory array MA, a sequencer SEQ, an address bus ADB carrying word addresses AD, and a data bus DTB.

The hard-wired logic or microprocessor sequencer executes instructions (INST) for erasing and programming memory cells, as well as instructions for reading data from the memory array.

In programming phase, the sequencer SEQ supplies two pulsed control signals VRFY1, VRFY2 which enable the two read-verify steps according to the present invention to be paced. The signals VRFY1, VRFY2 are formed by shifted pulses, the signal VRFY1 first of all being on 1 and the signal VRFY2 on 0, then the signal VRFY1 being on 0 and the signal VRFY2 on 1.

The memory further comprises voltage generators VGEN1, VGEN2 controlled by the sequencer. In programming phase, the generator VGEN1 supplies programming voltage Vpp pulses shifted in relation to the pulses VRFY1, VRFY2, such that a programming cycle comprises a pulse VRFY1, then a pulse VRFY2, then a pulse of voltage Vpp, as represented in the bottom left of FIG. 7. The verify pulses VRFY1, VRFY2 are shorter than the programming pulses, since the duration of a read operation is generally very short, for example a few tens of nanoseconds compared with a few microseconds for a programming pulse. The generator VGEN2 supplies the read-verify voltages Vy1, Vy2 in programming phase, and supplies the read voltage $V_{read}$ in reading phase.

The decoder WLDEC receives a word line address ADH formed by the most significant address bits of the address AD present on the address bus, and applies a determined selection voltage on the selected word line, i.e. to the control gates of the memory cells linked to this word line. The selection voltage is supplied to the decoder WLDEC by a voltage multiplexer VMUX controlled by the sequencer. In programming phase, the multiplexer VMUX1 receives the read-verify voltages Vy1, Vy2 and the voltage Vpp at input, and supplies the following selection voltages to the decoder WLDEC:

the voltage Vy1 when the control signal VRFY1 has a logic value of 1, the voltage Vy2 when the control signal VRFY2 has a logic value of 1, and the voltage Vpp when a pulse of voltage Vpp is sent by the generator VGEN1.

Thus, the control gates of the selected memory cells successively receive the voltages Vy1, Vy2, Vpp during steps corresponding to the duration of the pulses VRFY1, VRFY2, Vpp.

The decoder COLDEC receives a logic column address ADL formed by the least significant bits of the address AD. Such a logic column address corresponds to the address of a word of n bits, and enables one and only one bit line to be selected in each of the n physical columns. The decoder COLDEC thus comprises n decoding blocks CDk (CD0, CD1, ... CDn−1). Each decoding block CDk is combined with an electric column COLk and comprises n inputs linked to the bit lines of the column and an output. Each decoding block CDk selects at its output a bit line BLk,j of the corresponding column COLk, according to the logic column address ADL.

The output of each decoding block CDk is linked to a read circuit RCTk according to the present invention (RCT0, RCT1, ... RCTn−1) and to a programming circuit PCTk (PCT0, PCT1, ... PCTn−1). Each read circuit RCTk comprises a sense amplifier SA and a serial comparator SCOMP. The sense amplifier SA, an example of which has been described above, has a read input linked to an output of the decoding block CDk and an output linked to the data bus DTB and to the comparator SCOMP. The output of the comparator SCOMP is linked to the programming circuit PCTk of corresponding rank. Each programming circuit PCTk comprises a data latch DLT, a control circuit CONTCT and a program latch PLT. The input of the latch DLT is linked to the data bus DTB and receives a bit Bpk (Bp0, Bp1 ... Bpn−1) to be saved in a memory cell of the physical column of corresponding rank. The control circuit CONTCT has an input linked to the output of the latch DLT for receiving the bit Bpk, and another input linked to the output of the comparator SCOMP, receiving a bit Bdrk (Bdrk0, Bdrk1, ... Bdrkn−1) supplied by the comparator SCOMP, and an output supplying a signal DTOKk. The program latch PLT has an output linked to the output of the decoding block CDk, a command input receiving the signal DTOKk, a trigger input receiving the verify signal VRFY2 (common to all of the program latches) and an input receiving the programming voltage Vpp.

Saving a binary word comprising n bits Bp0, Bp1, Bp2, ... Bpk, ... Bpn−1 in the memory array comprises the following steps:

applying a word line address ADH (page address) to the word line decoder WLDEC and applying to the column decoder COLDEC a logic column address ADL corresponding to the rank of the target word in the selected page, the decoders WLDEC, COLDEC selecting n corresponding memory cells;

erasing the selected page by means of the word line decoder WLDEC (all the bits are put to 1);

loading the bits Bp0, Bp1, Bp2, ... Bpk, Bpn−1 into the latches DLT of the programming circuits PCTk, one bit per latch; and applying programming cycles to each memory cell to be programmed, until all of the memory cells are programmed.

Each programming cycle is paced by a pulse VRFY1, a pulse VRFY2 and a pulse Vpp. Upon the rising edge of the pulse VRFY1, the decoder WLDEC receives the voltage Vy1 and applies it to the selected word line, such that all of the memory cells of the word line receive the voltage Vy1 at their gate. Simultaneously, each sense amplifier reads one of the selected memory cells and supplies a first bit Brk1. Upon the falling edge of the pulse VRFY1, each serial comparator SCOMP present in each read circuit RCTk stores the corresponding bit Brk1 (k being an index ranging from 1 to n as indicated above). Upon the rising edge of the pulse VRFY2, the decoder WLDEC receives the voltage Vy2 and applies it to the selected word line. Simultaneously, each sense amplifier reads one of the selected memory cells and supplies a second bit Brk2. Upon the falling edge of the pulse VRFY2, each serial comparator SCOMP stores the corresponding bit Brk2.

When the second read-verify is finished, the output of the serial comparator SCOMP of each read circuit RCTk supplies a bit Bdrk. The bit Bdrk is the result of reading, in two steps, the memory cell and is equal to:

$$Bdrk=Brk1+Brk2 \quad (1)$$

Where "+" represents an OR function.

Thus, the bit Bdrk changes to 0 (erase logic value) if the two bits Brk1 and Brk2 are both equal to 0. As was seen above, a memory cell that is not yet completely programmed (or even a cell in the erased state) but that is seen as being programmed during the read performed with the voltage Vy1 due to a degradation of its transconductance, will here be detected since the reading of this cell with the voltage Vy2 shows that the cell has a non-zero current Ids and that its threshold voltage is therefore below the threshold sought for a programmed memory cell. In such a case, the bit Brk1 is equal to 0 but the bit Brk2 is equal to 1, such that the bit Bdrk resulting from the double read remains equal to 1.

The control circuit CONTCT is an asynchronous logic circuit and the signal DTOKk supplied by this circuit depends on the bit to be written Bpk and on the bit Bdrk read in two steps. The signal DTOKk may be for example, the result of the following logic equation:

$$DTOKk=Bpk+/Bpk*/Bdrk \quad (2)$$

where "*" represents an AND function.

Thus, upon the falling edge of the pulse VRFY2, the signal DTOKk changes to 1 in the following cases:

if the bit to be saved, Bpk, is equal to 1, which means that there is no programming to be performed on the memory cell, and if the bit to be saved Bpk is equal to 0 and the bit read Bdrk is equal to 0 (result of the double read), which means that it is no longer necessary to apply programming voltage pulses to the memory cell since the memory cell is programmed.

When the pulse of voltage Vpp appears, the program latch PLT is transparent if the signal DTOKk has a logic value of 0 and the program latch PLT is off if the signal DTOKk has a logic value of 1. When the latch is transparent, it transmits the programming voltage Vpp pulse to the bit line as the pulse is sent.

The programming cycle is repeated for each memory cell to be programmed (Bpk=0) until the bits Brk1 and Brk2 are equal to 0 (Bdrk=0). The memory cells programmed simultaneously can thus receive, relative to one another, a different number of programming pulses, if they do not have the same threshold voltage at the beginning of the programming cycle and/or if the degradation of their transconductance curves is different.

To control the entire programming operation, the signals DTOKk (DTOK0 to DTOKn−1) are collected by an AND-type logic gate G1, the output of which delivers a collective signal DTOK which changes to 1 when all of the individual signals DTOKk have a logic value of 1. The signal DTOK is loaded as a flag into a state register SREG of a memory, and is refreshed on each programming cycle. The sequencer SEQ stops sending the programming voltage Vpp pulses (stops the generator VGEN1) when the collective signal DTOK changes to 1. The sequencer also stops sending the programming voltage Vpp pulses when the signal DTOK does not change to 1 after N programming voltage pulses have been applied. In such a situation, at least one memory cell is defective and cannot be programmed. A flag PFAIL (Program Fail) is set to 1 in the register SREG. The PFAIL flag may be used to inform the user of a programming error.

FIG. 8 represents an example embodiment of a programming circuit PCTk and a read circuit RCTk according to the present invention.

The program latch PLT comprises an inverting gate INV1, a synchronous D flip-flop DL2, a voltage adapter VAD and an NMOS transistor TN1. The inverting gate receives the signal DTOKk supplied by the control circuit CONTCT and applies the inverted signal DTOKk to the D input of the flip-flop DL2, the Q output of which is applied to the input of the voltage adapter VAD. The latter is powered by a voltage Vpp+VTH, VTH being the threshold voltage of the transistor TN1, and its output drives the gate of transistor TN1. The output of the adapter VAD transforms a logic signal equal to 1 supplied by the flip-flop DL2 into a signal of voltage Vpp+VTH, while a logic signal on 0 is copied as a signal of zero voltage which causes the transistor TN1 to turn off. The trigger input H of the flip-flop DL2, which is active on falling edges, receives the pulses of the signal VRFY2. The drain of the transistor TN1 receives the programming voltage Vpp pulses. The source of the transistor TN1 is linked to a bit line BLk,j via the column decoder COLDEC. Thus, the Q output of the flip-flop DL2 is refreshed upon each falling edge of the signal VRFY2, and copies the value present on the D input. If the signal DTOKk has a logic value of 0, the Q output changes to 1 and the adapter supplies the voltage Vpp+VTH to the gate of the transistor TN1, which becomes or remains on. When the voltage Vpp pulse is sent, it is transmitted by the transistor TN1 to the bit line BLk,j and a selected memory cell receives the programming voltage Vpp.

The control circuit CONTCT comprises an OR-type logic gate G4 that receives the bit to be saved Bpk and the bit Bdrk at input. The output of the gate G4 is applied to an input of a NXOR-type gate G5 receiving the bit to be saved Bpk at a second input. The output of the gate G5 supplies the signal DTOKk, which is equal to:

$$DTOKk=Bpk+/Bpk*/Bdrk+Bpk*Bdrk \quad (3)$$

i.e.:

$$DTOKk=Bpk*(1+Bdrk)+/Bpk*/Bdrk \quad (3bis)$$

and i.e.:

$$DTOKk=Bpk+/Bpk*/Bdrk, \quad (3ter)$$

this equation being identical to equation 2 described above.

The sense amplifier SA has the structure described above in relation to FIG. 6 and comprises the inputs RIN, MIN, AIN, REFIN and the data output DOUT. The read input RIN is linked to a bit line BLk,j through the column decoder decoding block CDk of corresponding rank as well as through an NMOS-type read transistor RT. The transistor RT, provided for insulating the input RIN of the amplifier SA from the voltage Vpp pulses applied to the bit line, is arranged between the output of the decoding block CDk and the input RIN. It is driven by a signal READ here supplied by the output of an OR-type gate G6 receiving the signals VRFY1, VRFY2 at input. The transistor RT is thus on during the read-verify steps, when the signal READ is equal to 1. The input MIN receives the signal MODE that is supplied by the sequencer (See FIG. 7) and enables the sense amplifier SA to be switched into an appropriate operating mode (read-verify mode or simple read mode) by selecting the corresponding reference cell (only the reference cell of the read-verify mode being represented in FIG. 6, as indicated above). The activation input AIN receives the signal READ, such that the current comparison branches of the amplifier are activated when one of the signals VRFY1, VRFY2 has a logic value of 1. Finally, the reference voltage Vgref applied to the input REFIN is supplied by a voltage multiplexer VMUX2 receiving the read voltages Vy1, Vy2 at the input. The multiplexer is driven by the signals VRFY1, VRFY2 so that Vgref is equal to Vy1 when VRFY1 is equal to 1 and Vgref is equal to Vy2 when VRFY2 is equal to 1.

During the reading phases, one of the signals VRFY1, VRFY2 is used as a read signal equivalent to the read signal of a conventional memory, to take the signal READ to 1. Similarly, one of the two conduction paths carrying the voltages Vy1, Vy2 is used to carry the read voltage $V_{read}$ (See FIGS. 3 and 4) during the reading phases.

The serial comparator SCOMP comprises two synchronous D flip-flops DL11, DL12. The flip-flop DL11 has a D input connected to the output DOUT of the sense amplifier SA, a clock input H receiving the signal VRFY1, active on a falling edge, and a Q output supplying the bit Brk1, connected to a first input of an OR-type gate G7. The flip-flop DL12 has a D input also connected to the output DOUT of the sense amplifier SA, a clock input H receiving the signal VRFY2, active on a falling edge, and a Q output supplying the bit Brk2 and connected to another input of the gate G7. Each flip-flop DL11, DL12 also has an input SET receiving a signal RST supplied by the sequencer SEQ, and is put back to 1 (output Q=1) at the beginning of a programming operation. The output of the gate G7 supplies the bit Bdrk.

FIGS. 9A to 9F are timing diagrams depicting the programming of memory cells. FIG. 9A illustrates the control pulses VRFY1, VRFY2 and the pulses of voltage Vpp. FIGS. 9B, 9C respectively depict the bits Brk1, Brk2 at the output of the flip-flops D11, D12. FIG. 9D depicts the bit Bdrk at the output of the comparator SCOMP. FIG. 9E illustrates the bit Bpk loaded into the data latch DLT. FIG. 9F represents the signal DTOKk. It is assumed here that the memory cell has been erased beforehand and that it has a degraded transconductance, which could only be detected during the read-verify step performed with the voltage Vy2. It is further assumed that the bit Bpk to be written in the memory cell is equal to 0 and that the 0 corresponds by convention to the programming logic value (value read in a programmed memory cell).

At time t0 the bit Bpk (FIG. 9E) is loaded into the latch DLT the output of which thus changes to 0. At time t2 the flip-flops D11, D12 are put to 1 (signal RST on the input SET) such that the bits Brk1, Brk2 are forced to 1. At time t3 the first actual programming cycle begins, comprising the read-verify step (VRFY=1) performed with the read voltage Vy1, the read-verify step (VRFY=2) performed with the read voltage Vy2, and the programming step (Vpp=1 on the timing diagram in FIG. 9A meaning that the pulse of voltage Vpp is sent). At time t6 occurring after a determined number of programming cycles, the bit Brk1 changes to 0 upon a falling edge of the signal VRFY1. Thus, the memory cell has been read as programmed by the sense amplifier SA during the read-verify step performed with the voltage Vy1. However, at time t7 corresponding to the falling edge of the next pulse of the signal VRFY2, the bit Brk2 remains on 1, which means that the memory cell has been read as erased (reading a 1) by the sense amplifier during the read-verify step performed with the voltage Vy2. Thus, the resulting bit Bdrk remains on 1 and the programming cycles continue. At time t8 corresponding to a falling edge of the signal VRFY2, the bit Brk2 changes to 0 which means that the cell has been read as programmed with the read-verify voltage Vy2. As the bit Brk1 has already changed to 0 at time t6, the change to 0 of the bit Brk2 causes the resulting bit Bdrk to change to 0, which causes the signal DTOKk to change to 1. Thus, the Q output of the flip-flop DL2 (See FIG. 8) of the program latch PLT remains on 0 during the next voltage Vpp pulses, and the memory cell no longer receives the voltage Vpp. The phase of programming the memory cell is finished and the detection of the transconductance fault has enabled the threshold voltage of the memory cell to be taken to at least the threshold Vy2.

It will be understood by those skilled in the art that various alternative embodiments of the method and the memory according to the present invention are possible, particularly as regards the sequencing of the programming cycles, the structure of the means used to control the read-verify phases, the structure of the sense amplifier, etc. In particular, although a sense amplifier has been described that uses a reference memory cell to set the threshold current Iref1, this current can be otherwise obtained, by means, for example, of a voltage- and temperature-stable current source for example.

Furthermore, the present invention is applicable to various types of memories in which a programming operation is conducted in several verify-program cycles, particularly serial Flash memories, Flash memories with parallel inputs/outputs, and the like, and is not reserved solely for page-erasable Flash memories.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A method for programming a memory cell comprising:
    applying a first read voltage to a control gate of the memory cell having a floating gate capacitively coupled thereto;
    comparing a first read current through the memory cell resulting from the first read voltage with a first threshold;
    applying a second read voltage to the control gate of the memory cell if the first read current is less than the first threshold;
    comparing a second read current through the memory cell resulting from the second read voltage with a second threshold; and
    applying a programming voltage signal to the control gate if the second read current is greater than the second threshold to modify an amount of electric charge stored on the floating gate.

2. The method of claim 1, wherein the programming voltage signal comprises a programming voltage pulse.

3. The method of claim 1, further comprising repeating, until the second read current is less than the second threshold: applying a second read voltage to the control gate of the memory cell if the first read current is less than the first threshold; comparing a second read current through the memory cell resulting from the second read voltage with a second threshold; and applying a programming voltage signal to the control gate if the second read current is greater than the second threshold to modify an amount of electric charge stored on the floating gate.

4. The method of claim 3, wherein repeating further comprises terminating the application of the programming voltage after a predetermined number of repetitions.

5. A method for identifying a degraded memory cell comprising:
applying a first read voltage to a control gate of the memory cell;
comparing a first read current through the memory cell resulting from the first read voltage with a first threshold;
applying a second read voltage to the control gate of the memory cell if the first read current is less than the first threshold;
comparing a second read current through the memory cell resulting from the second read voltage with a second threshold; and
identifying the memory cell as being degraded if the second read current is greater than the second threshold.

6. The method of claim 5, wherein comparing further comprises comparing the first read current to a first reference current flowing through a non-degraded reference memory cell, wherein the first reference current comprises the first threshold.

7. The method of claim 5, wherein comparing further comprises comparing the second read current to a second reference current, wherein the second reference current comprises the second threshold.

8. A memory comprising:
a memory cell;
a first read circuit configured to apply a first read voltage to the memory cell and compare a first read current through the memory cell resulting from the first read voltage with a first threshold;
a second read circuit configured to apply a second read voltage to the memory cell if the first read current is less than the first threshold and configured to compare a second read current through the memory cell resulting from the second read voltage with a second threshold; and
a programming circuit configured to apply a programming voltage signal to the memory cell if the second read current is greater than the second threshold, wherein the programming voltage signal at least partially programs the memory cell.

9. The memory of claim 8, wherein the memory cell comprises a floating gate transistor.

10. The memory of claim 8, wherein the second threshold is between zero nanoamperes and one thousand nanoamperes.

11. A method of programming a memory cell comprising:
applying a first read voltage greater than a reference voltage to a control gate of the memory cell;
applying a second read voltage less than first reference to the control gate of the memory cell;
comparing a first read current through the memory cell resulting from the first read voltage with a first current threshold;
comparing a second read current through the memory cell resulting from the second read voltage with a second current threshold; and
applying a programming voltage signal to the control gate of the memory cell in response to the memory cell not being in a target program state.

12. The method of claim 11, further comprising:
repeating, until the second read current is less than the second current threshold, the steps of: applying a second read voltage less than the first reference to the control gate of the memory cell; comparing a second read current through the memory cell resulting from the second read voltage with a second current threshold; and applying a programming voltage signal to the control gate of the memory cell.

13. The method of claim 11, further comprising:
repeating for a predetermined number of time the steps of: applying a second read voltage less than the first reference to the control gate of the memory cell; comparing a second read current through the memory cell resulting from the second read voltage with a second current threshold; and applying a programming voltage signal to the control gate of the memory cell.

14. The method of claim 11, further comprising:
finding a first program state having a first value indicating that the memory cell is not programmed when the first read current is greater than the first current threshold and a second value indicating that the memory cell is programmed when the first read current is not greater than the first current threshold;
finding a second program state having a first value indicating that the memory cell is not programmed when the second read current is greater than the second current threshold and a second value indicating that the memory cell is programmed when the second read current is not greater than the second current threshold; and
finding a logical program state based upon both the first program state and the second program state.

15. The method of claim 14, wherein the logical program state indicates the memory cell is not programmed when either the first program state or the second program state indicates that the memory cell is not programmed.

16. The method of claim 14, further comprising:
storing the first and the second program states.

* * * * *

UNITED STATES PATENT AND TRADEMARK OFFICE
CERTIFICATE OF CORRECTION

PATENT NO.       : 7,453,732 B2
APPLICATION NO.  : 11/742334
DATED            : November 18, 2008
INVENTOR(S)      : Jean Devin Page 1 of 1

It is certified that error appears in the above-identified patent and that said Letters Patent is hereby corrected as shown below:

<u>On the Title Page</u>
Item (57) Abstract, line 6, "the verify step comprises a first read of the memory cell with" should read as -- the verifying step comprises a first read of the memory cell with --

<u>Column 16</u>
Line 7, "applying a second read voltage less than first reference to" should read as -- applying a second read voltage less than the reference voltage to --

Lines 20-26, "applying a second read voltage less than the first reference to the control gate of the memory cell; comparing a second read current through the memory cell resulting from the second read voltage with a second current threshold; and applying a programming voltage signal to the control gate of the memory cell" should read as -- applying the second read voltage less than the reference voltage to the control gate of the memory cell; comparing the second read current through the memory cell resulting from the second read voltage with the second current threshold; and applying the programming voltage signal to the control gate of the memory cell --

Line 28, "repeating for a predetermined number of time the steps of:" should read as -- repeating for a predetermined number of times the steps of: --

Signed and Sealed this

Tenth Day of March, 2009

JOHN DOLL
*Acting Director of the United States Patent and Trademark Office*